(12) United States Patent
Moosburger et al.

(10) Patent No.: US 9,812,619 B2
(45) Date of Patent: Nov. 7, 2017

(54) OPTOELECTRONIC COMPONENT AND METHOD FOR PRODUCING SAME

(71) Applicant: OSRAM Opto Semiconductors GmbH, Regensburg (DE)

(72) Inventors: Jürgen Moosburger, Lappersdorf (DE); Thomas Schwarz, Regensburg (DE); Hans-Jürgen Lugauer, Sinzing (DE); Tansen Varghese, Regensburg (DE); Stefan Illek, Donaustauf (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/769,060

(22) PCT Filed: Jan. 15, 2014

(86) PCT No.: PCT/EP2014/050701
§ 371 (c)(1),
(2) Date: Aug. 19, 2015

(87) PCT Pub. No.: WO2014/127934
PCT Pub. Date: Aug. 28, 2014

(65) Prior Publication Data
US 2016/0013380 A1   Jan. 14, 2016

(30) Foreign Application Priority Data

Feb. 22, 2013 (DE) .......... 10 2013 202 910

(51) Int. Cl.
*H01L 29/18* (2006.01)
*H01L 33/58* (2010.01)
(Continued)

(52) U.S. Cl.
CPC .......... *H01L 33/58* (2013.01); *H01L 21/78* (2013.01); *H01L 25/0753* (2013.01); *H01L 25/50* (2013.01); *H01L 33/005* (2013.01); *H01L 33/54* (2013.01); *H01L 33/62* (2013.01); *H01L 2224/48091* (2013.01); *H01L 2933/005* (2013.01); *H01L 2933/0058* (2013.01); *H01L 2933/0066* (2013.01)

(58) Field of Classification Search
CPC ..... H01L 33/486; H01L 33/507; H01L 33/52; H01L 33/58
USPC ....................... 257/88, 98, 99, 100
See application file for complete search history.

(56) References Cited

U.S. PATENT DOCUMENTS

| | | |
|---|---|---|
| 4,501,637 A | 2/1985 | Mitchell et al. |
| 6,018,167 A | 1/2000 | Oota |

(Continued)

FOREIGN PATENT DOCUMENTS

| | | |
|---|---|---|
| DE | 19757850 A1 | 7/1998 |
| DE | 19829197 A1 | 1/2000 |

(Continued)

*Primary Examiner* — Matthew E Warren
(74) *Attorney, Agent, or Firm* — Slater Matsil, LLP (57) ABSTRACT

The present application relates to a method of producing an optoelectronic component. An optoelectronic is produced by this method. An optoelectronic semiconductor chip has a first surface. A sacrificial layer is deposited on the first surface. The optoelectronic semiconductor chip is at least partially embedded in a mold body and the sacrificial layer is removed.

7 Claims, 5 Drawing Sheets

(51) Int. Cl.
*H01L 33/54* (2010.01)
*H01L 21/78* (2006.01)
*H01L 25/075* (2006.01)
*H01L 25/00* (2006.01)
*H01L 33/00* (2010.01)
*H01L 33/62* (2010.01)

(56) References Cited

U.S. PATENT DOCUMENTS

| | | |
|---|---|---|
| 7,105,862 B2 | 9/2006 | Waitl et al. |
| 7,208,769 B2* | 4/2007 | Guenther ............. H01L 33/505 |
| | | 257/88 |
| 8,716,744 B2* | 5/2014 | Chan .................... H01L 33/486 |
| | | 257/100 |
| 8,723,192 B2 | 5/2014 | Weidner et al. |
| 2012/0241797 A1* | 9/2012 | Kim ...................... H01L 33/505 |
| | | 257/98 |
| 2013/0193470 A1 | 8/2013 | Weidner et al. |
| 2013/0221380 A1* | 8/2013 | Ankireddi ........... H01L 25/0753 |
| | | 257/88 |
| 2013/0248484 A1* | 9/2013 | Wu ....................... G02B 5/201 |
| | | 216/12 |

FOREIGN PATENT DOCUMENTS

| | | |
|---|---|---|
| DE | 102009036621 A1 | 2/2011 |
| DE | 102010033963 A1 | 2/2012 |
| DE | 102010046257 A1 | 3/2012 |
| EP | 1592074 A2 | 11/2005 |
| WO | 2012016377 A1 | 2/2012 |

* cited by examiner

OPTOELECTRONIC COMPONENT AND METHOD FOR PRODUCING SAME

This patent application is a national phase filing under section 371 of PCT/EP2014/050701, filed Jan. 15, 2014, which claims the priority of German patent application 10 2013 202 910.1, filed Feb. 22, 2013, each of which is incorporated herein by reference in its entirety.

TECHNICAL FIELD

The present invention relates to a method of producing an optoelectronic component.

BACKGROUND

In the prior art, optoelectronic components comprise housings fulfilling several functionalities. These include providing electrical connections for optoelectronic semiconductor chips of the optoelectronic components, providing suitable mounting interfaces, e.g., for surface mounting according to an SMT technique, and mechanically connecting the individual parts of the optoelectronic components. Also, protective ESD diodes may be integrated for protecting an optoelectronic semiconductor chip of the optoelectronic component against damage resulting from an electrostatic discharge, as well as devices for injecting and uncoupling light, for forming beams or for converting wavelengths. Due to this multitude of functionalities to be fulfilled, the housings of conventional optoelectronic components constitute a significant expense factor.

German Patent Document DE 10 2009 036 621 A1, also published as U.S. Pat. No. 8,723,192 B2, discloses a method of producing an optoelectronic component, wherein optoelectronic semiconductor chips are arranged at an upper surface of a carrier. The optoelectronic semiconductor chips are encapsulated in a mold body covering all lateral surfaces of the optoelectronic semiconductor chip. Top and bottom surfaces of the optoelectronic semiconductor chips preferably remain free. After removing the carrier, the optoelectronic semiconductor chips may be singularized. At the top and/or bottom surfaces of each semiconductor chip, contact points may be provided. The mold body may e.g., consist of an epoxy-based mold material.

SUMMARY

Embodiments of the present invention provide a method of producing an optoelectronic component. Further embodiments of the present invention is provide an optoelectronic component.

A method of producing an optoelectronic component comprises steps of providing an optoelectronic semiconductor chip having a first surface, of depositing a sacrificial layer on the first surface, of forming a mold body into which the optoelectronic semiconductor chip is at least partially embedded, and of removing the sacrificial layer. Advantageously, this method allows for producing an optoelectronic component having a mold body, the mold body comprising a recess adjacent to the optoelectronic semiconductor chip embedded in the mold body. The recess is precisely aligned with the optoelectronic semiconductor chip without requiring previous precise placing of the semiconductor chip or of another part. The recess of the mold body may then advantageously be used for positioning further parts of the optoelectronic component relative to the optoelectronic semiconductor chip with high precision. Advantageously, the method does not involve complex lithographical process steps.

In an embodiment of the method, a further step is carried out prior to removing the sacrificial layer for partially removing the mold body in order to render the sacrificial layer accessible. As a result, the sacrificial layer advantageously does not have to remain free while embedding the optoelectronic semiconductor chip into the mold body, but may be covered by the mold body. While partially removing the mold body, the optoelectronic semiconductor chip is advantageously protected by the sacrificial layer, thus preventing damage to the optoelectronic semiconductor chip.

In an embodiment of the method, the first surface of the optoelectronic semiconductor chip is provided for the passage of electromagnetic radiation. Advantageously, the recess in the mold body of the optoelectronic component is then arranged adjacent to the beam-passage surface of the optoelectronic semiconductor chip. This allows for using the recess in the mold body for a self-aligning arrangement of a part of the optoelectronic component relative to the beam-passage surface of the optoelectronic semiconductor chip.

In an embodiment of the method, an electrically conductive contact pin having a contact-pin-sacrificial layer arranged thereon is embedded in the mold body together with the optoelectronic semiconductor chip. Subsequently, the contact-pin-sacrificial layer is removed together with the sacrificial layer. Advantageously, the contact pin embedded in the mold body may then be used for guiding an electrical connection through the mold body.

In an embodiment of the method, the method comprises a further step of establishing an electrically conductive connection between an electrical contact arranged at the first surface of the optoelectronic semiconductor chip and the contact pin. Advantageously, the contact pin then guides an electrically conductive connection to the electrical contact of the optoelectronic semiconductor chip through the mold body, thus allowing for electrically contacting the optoelectronic semiconductor chip at the other side of the mold body.

In an embodiment of the method, the method comprises a further step of arranging an optical lens at an upper surface of the mold body. Advantageously, the recess formed in the mold body adjacent to the optoelectronic semiconductor chip allows for a precise self-aligning orientation of the optical lens with regard to the optoelectronic semiconductor chip. In order to align the optical lens, a time-consuming and expensive placement of the optical lens with high precision is thus not required.

In an embodiment of the method, the optoelectronic semiconductor chip is embedded in the mold body in such a way that a second surface of the optoelectronic semiconductor chip lies flush with a bottom surface of the mold body. Advantageously, the second surface of the optoelectronic semiconductor chip is then accessible at the bottom surface of the mold body of the optoelectronic semiconductor chip. This allows for electrically contacting the optoelectronic semiconductor chip of the optoelectronic component at the bottom surface of the mold body.

In an embodiment of the method, prior to forming the mold body a step is carried out of arranging the optoelectronic semiconductor chip on a carrier, wherein the second surface of the optoelectronic semiconductor chip is arranged to face an upper surface of the carrier. Advantageously, this method step guarantees that the second surface of the optoelectronic semiconductor chip remains accessible at the bottom surface of the subsequently formed mold body.

In an embodiment of the method, the optoelectronic semiconductor chip is separated from a wafer between the deposition of the sacrificial layer and the forming of the mold body. Advantageously, deposition of the sacrificial layer is then carried out on the wafer of the optoelectronic semiconductor chip, thus allowing for simultaneously supplying the provision of a plurality of optoelectronic semiconductor chips with a sacrificial layer in an inexpensive manner.

In an embodiment of the method, a plurality of optoelectronic semiconductor chips is jointly embedded into the mold body. Later, the mold body is divided in order to obtain a plurality of optoelectronic components. Advantageously, the method thus allows for a parallel manufacture of a plurality of optoelectronic components in shared method steps. Advantageously, this results in a drastic reduction of the manufacturing costs for each optoelectronic component.

An optoelectronic component comprises an optoelectronic semiconductor chip having a first surface. The optoelectronic semiconductor chip is embedded into a mold body with an upper surface. The first surface of the optoelectronic semiconductor chip is accessible at the upper surface of the mold body. The upper surface of the mold body is elevated with regard to the first surface of the optoelectronic semiconductor chip. Advantageously, the elevated upper surface of the mold body forms an adjustment area around the first surface of the optoelectronic semiconductor chip embedded into the mold body of the optoelectronic component, at which further parts of the optoelectronic component may be oriented relative to the optoelectronic semiconductor chip with high precision in a self-aligning manner.

In an embodiment of the optoelectronic component, the first surface of the optoelectronic semiconductor chip is provided for the passage of electromagnetic radiation. Advantageously, the adjustment area formed by the part of the mold body which is elevated over the first surface of the optoelectronic semiconductor chip is thus arranged above the radiation-passage area of the optoelectronic semiconductor chip which allows for a precise and self-aligning orientation of a part of the optoelectronic component above the radiation-passage area of the optoelectronic semiconductor chip.

In an embodiment of the optoelectronic component, an optical lens is arranged on the upper surface of the mold body. Advantageously, the lens may be oriented in a self-aligning and precise manner relative to the optoelectronic semiconductor chip at the adjustment area formed by the elevated section of the mold body, which may result in high-quality optical properties of the optoelectronic component.

In an embodiment of the optoelectronic component, the optical lens abuts an adjustment structure which is integrally formed with the mold body. Advantageously, the optoelectronic component has a simple design consisting of a small number of individual parts and may thus be produced in an inexpensive manner.

In an embodiment of the optoelectronic component, an electrically conductive contact pin is embedded in the mold body. The contact pin is accessible at an upper surface of the mold body. An electrical contact arranged at the first surface of the optoelectronic semiconductor chip is in this context connected to the contact pin in an electrically conductive manner. Advantageously, the optoelectronic semiconductor chip of the optoelectronic component may then be electrically contacted at a bottom surface of the mold body opposite to the upper surface of the mold body. The electrical connection is thereby guided via the contact pin and the electrically conductive connection between the contact pin and the electrical contact at the first surface of the optoelectronic semiconductor chip.

In an embodiment of the optoelectronic component, a second surface of the optoelectronic semiconductor chip is accessible at a bottom surface of the mold body and lies flush with the bottom surface of the mold body. Advantageously, a second electrical contact of the optoelectronic semiconductor chip of the optoelectronic component may then be electrically contacted at the second surface of the optoelectronic semiconductor chip at the bottom surface of the mold body. This allows for electrically contacting the optoelectronic component, e.g., by means of reflow soldering after a technique for surface mounting (SMT) has been carried out.

In an embodiment of the optoelectronic component, a metallization is arranged at the second surface of the optoelectronic semiconductor chip. Advantageously, the metallization may serve to electrically contact the optoelectronic semiconductor chip by means of a soldering method.

BRIEF DESCRIPTION OF THE DRAWINGS

The above-described properties, features and advantages of the present invention as well as the manner in which they are realized will become clearer in context with the following description of embodiment examples which are explained in more detail in conjunction with the drawings. Thereby, in respective schematic views.

DETAILED DESCRIPTION OF ILLUSTRATIVE EMBODIMENTS

Figure 1:
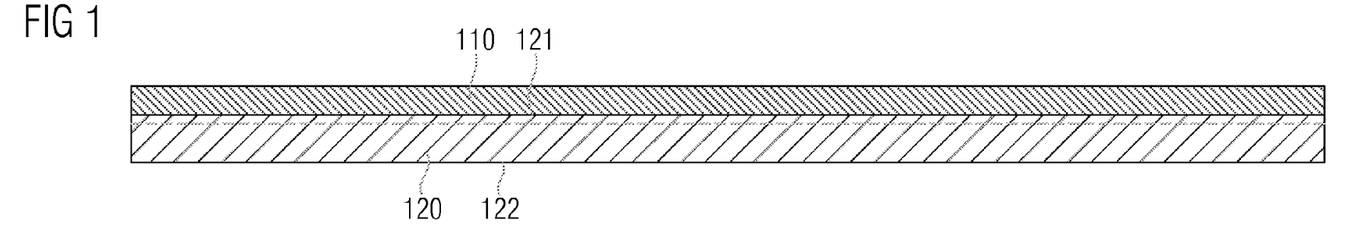
FIG. 1 shows a cross-section through a semiconductor wafer having a plurality of optoelectronic semiconductor chips and a sacrificial layer arranged thereon.

In a schematic view, FIG. 1 shows a cross-section through a semiconductor wafer 120. The semiconductor wafer 120 may also simply be referred to as wafer. The semiconductor wafer 120 is formed as a flat disk having a first surface 121 and a second surface 122 facing the first surface 121. In or on the semiconductor wafer 120, a plurality of optoelectronic semiconductor chips have been formed by means of semiconductor-technology processes which are not shown in detail in FIG. 1.

On the first surface 121 of the semiconductor wafer 120, a sacrificial layer 110 is arranged. The sacrificial layer 110 may, e.g., comprise a polymer or a dielectric. The sacrificial layer 110 may, e.g., have been applied to the first surface 121 of the semiconductor wafer 120 by means of spin coating or spray coating. After applying to the first surface 121 of the semiconductor wafer 120, the sacrificial layer 110 may additionally have been hardened, e.g., by heating. In a direction perpendicular to the first surface 121 of the semiconductor wafer 120, the sacrificial layer 110 may have a thickness in the range between a few μm and a few hundred μm.

Figure 2:
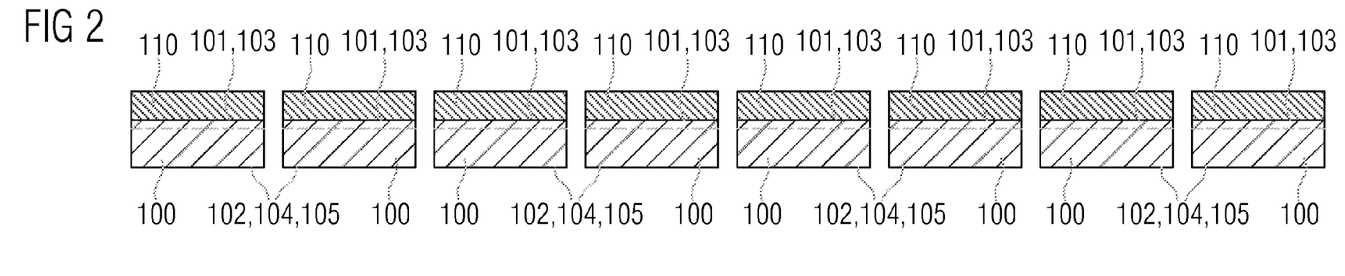
FIG. 2 depicts a plurality of optoelectronic semiconductor chips after cleaving the semiconductor wafer.

FIG. 2 depicts a schematic sectional view of a plurality of optoelectronic semiconductor chips 100 which have been formed by cleaving the semiconductor wafer 120 of FIG. 1. Each of the optoelectronic semiconductor chips 100 comprises a first surface 101 which has been formed of the first surface 121 of the semiconductor wafer 120. Moreover, each optoelectronic semiconductor chip 100 comprises a second surface 102 facing the first surface 101 which has been formed of the second surface 122 of the semiconductor wafer 120.

The first surface 101 of the optoelectronic semiconductor chip 100 is preferably a radiation-passage area which is provided for the passage of electromagnetic radiation, e.g., visible light. The optoelectronic semiconductor chips 100 may, e.g., be LED chips. In this case, the first surface 101 of the optoelectronic semiconductor chips 100 is preferably a radiation-emitting area through which electromagnetic radiation generated in the optoelectronic semiconductor chips 100 is emitted from the optoelectronic semiconductor chips 100. The optoelectronic semiconductor chips 100 may, e.g., also be solar-cell chips. In this case, the first surface 101 of the optoelectronic semiconductor chips 100 is preferably a radiation-entry surface through which the electromagnetic radiation such as sunlight enters into the optoelectronic semiconductor chips 100.

On the first surface 101 of each optoelectronic semiconductor chip 100, a first electrical contact 103 is arranged for electrically contacting the respective optoelectronic semiconductor chip 100. At the second surface 102 of each optoelectronic semiconductor chip 100, a second electrical contact 104 is arranged for electrically contacting the respective optoelectronic semiconductor chip 100. Moreover, a first contact pad 105 may be provided at the second surface 102 of each optoelectronic semiconductor chip 100 which serves in order to electrically contact the second electrical contact 104. The first contact pad 105 may, e.g., be a metallization.

On the first surface 101 of the optoelectronic semiconductor chip 100, a part of the sacrificial layer 110 is arranged. The sacrificial layer 110 has been divided together with the semiconductor wafer 120. The part of the sacrificial layer 110 arranged on the first surface 101 of each optoelectronic semiconductor chip 100 has the same lateral dimensions as the respective optoelectronic semiconductor chip 100.

Figure 3:
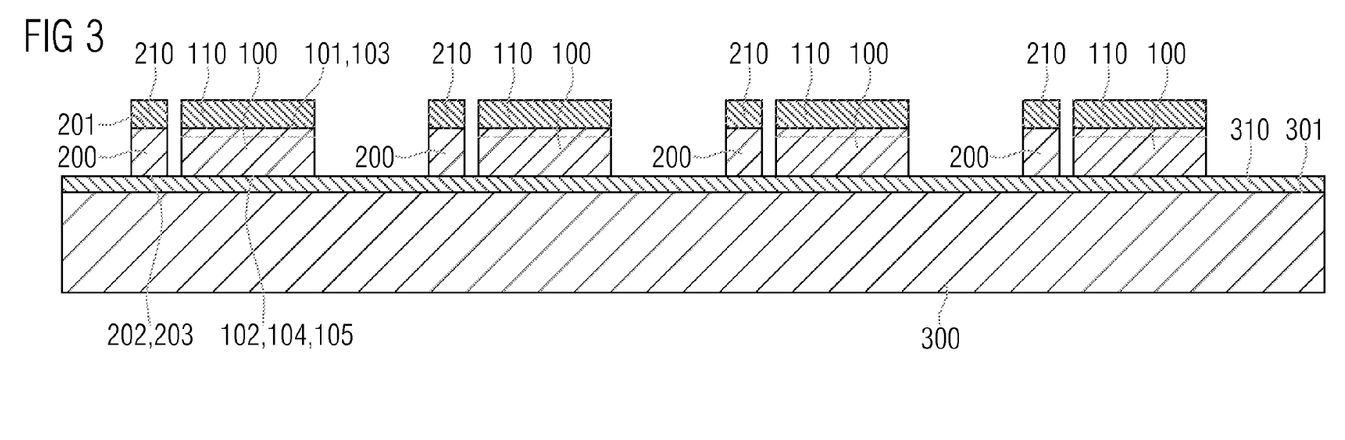
FIG. 3 shows a cross-section through a chip carrier with a plurality of optoelectronic semiconductor chips arranged thereon.

FIG. 3 shows a schematic sectional view of a chip carrier 300. The chip carrier 300 may, e.g., be part of an apparatus for carrying out a process for injection molding, transfer molding or for another molding process. In the depicted example, the chip carrier 300 comprises an essentially plane carrier surface 301. However, in other embodiments the carrier surface 301 might also be configured in a structured manner. On the carrier surface 301 of the chip carrier 300, an adhesive layer 310 is arranged. The adhesive layer 310 may, e.g., be a bilaterally adhesive film. The adhesive layer 310 may be formed in such a way that adhesion of the adhesive layer 310 may be reduced or removed by thermal, chemical or a different kind of treatment.

A plurality of optoelectronic semiconductor chips 100 are arranged on the adhesive layer 310 on the carrier surface 301 of the chip carrier 300. The optoelectronic semiconductor chips 100 are arranged on the chip carrier 300 in such a way that the second surface 102 of each optoelectronic semiconductor chip 100 faces the carrier surface 301 of the chip carrier 300.

The optoelectronic semiconductor chips 100 may, e.g., be arranged on the chip carrier 300 in a regular two-dimensional matrix arrangement and at a distance from each other. In this context, there are no high demands on the precision of placement of the individual optoelectronic semiconductor chips 100. The optoelectronic semiconductor chips 100 may be placed on the chip carrier 300 by means of a quick and inexpensive placement process (pick-and-place process).

In addition to the optoelectronic semiconductor chips 100, a plurality of contact pins 200 is arranged on the adhesive layer 310 on the carrier surface 301 of the chip carrier 300. The contact pins 200 comprise an electrically conductive material. For example, the contact pins 200 may comprise a doped semiconductor material or a metal.

For each optoelectronic semiconductor chip 100, one or a plurality of contact pins 200 may be provided. The one or the plurality of contact pins 200 of each optoelectronic semiconductor chip 100 are arranged closely to the respectively associated semiconductor chip 100, however, at a distance from it.

Each contact pin 200 comprises a first side 201 and a second side 202 opposite to the first side 201. The length of the contact pins 200 between the respective first side 201 and the respective second side 202 essentially corresponds to the thickness of the optoelectronic semiconductor chips 100 between the respective first surface 101 and the respective second surface 102.

At the second side 202 of each contact pin 200, a second contact pad 203 may be arranged which is suitable for producing a bond or soldering connection. The second contact pad 203 may, e.g., be a metallization.

At the first side 201 of each contact pin 200, a contact-pin-sacrificial layer 210 is arranged. The contact-pin-sacrificial layer 210, like the sacrificial layer 110, may be arranged on the first surface 101 of each optoelectronic semiconductor chip 100. In particular, the contact-pin-sacrificial layer 210 of each contact pin 200 has a thickness essentially corresponding to the thickness of the sacrificial layer 110 of the optoelectronic semiconductor chip 100.

Figure 4:
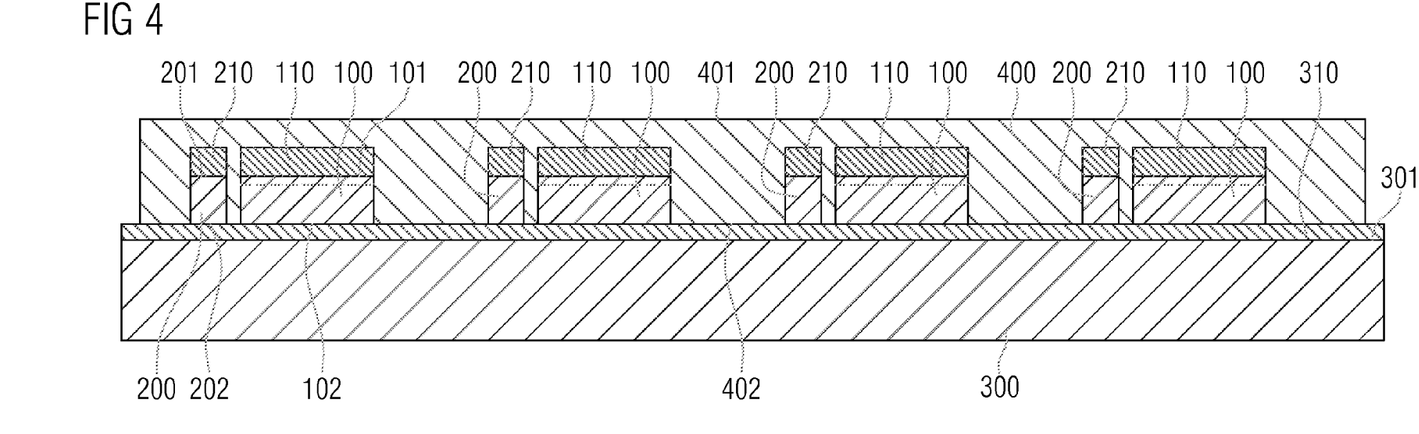
FIG. 4 shows a cross-section through the chip carrier with a mold body formed thereon.

In the next method step, a mold body is formed at the carrier surface 301 of the chip carrier 300. Thereby, the optoelectronic semiconductor chips 100 arranged on the carrier surface 301 of the chip carrier 100 and the contact pins 200 arranged on the carrier surface 301 of the chip carrier 300 are embedded in the mold body. FIG. 4 depicts a schematic sectional view of the mold body 400 at the carrier surface 301 of the chip carrier 300 with the embedded optoelectronic semiconductor chips 100 and the embedded contact pins 200.

The mold body 400 comprises an electrically isolating material, e.g., an epoxy-based mold material. The mold body 400 may, e.g., be produced by a mold process such as injection or transfer molding.

The mold body 400 comprises an upper surface 401 and a bottom surface 401 opposite to the upper surface 401. The bottom surface 402 of the mold body 400 is formed at the adhesive layer 310 arranged on the carrier surface 301 of the chip carrier 300.

The second surfaces 102 of the optoelectronic semiconductor chips 100 abutting the adhesive layer 310 at the carrier surface 301 of the chip carrier 300 and the second sides 202 of the contact pins 200 abutting the adhesive layer 310 are not covered by the mold body 400 but accessible at the bottom surface 402 of the mold body 400. The second surfaces 102 of the optoelectronic semiconductor chips 100 and the second sides 202 of the contact pins 200 thereby lie approximately flush with the bottom surface 402 of the mold body 400.

The first surface 101 of each optoelectronic semiconductor chip 100 and the sacrificial layer 110 arranged on the first surface 101 of each optoelectronic semiconductor chip 100 is covered by the mold body 400. Correspondingly, the first side 201 and the contact-pin-sacrificial layer 210 of each contact pin 200 arranged on the first side 201 are covered by the mold body 400.

Figure 5:
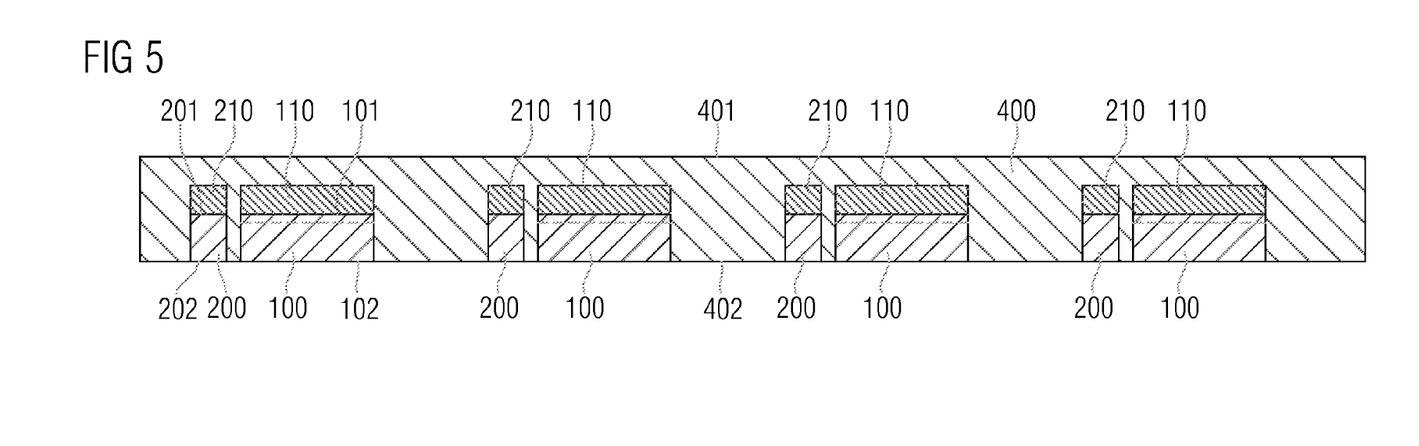
FIG. 5 depicts a cross-section through the mold body having optoelectronic semiconductor chips embedded therein.

In the next method step, the mold body 400 may be removed from the chip carrier 300. Here, the mold body 400 may be directly removed from the adhesive layer 310 remaining on the carrier surface 301 of the chip carrier 300. Alternatively, the adhesive layer 310 may at first be removed from the carrier surface 301 of the chip carrier 300 and subsequently from the bottom surface 402 of the mold body 400. In order to remove the adhesive layer 310, its adhesive properties may be reduced, e.g., by thermal, chemical or another kind of treatment. FIG. 5 shows a schematic sectional view of the mold body 400 after removing the mold body 400 from the chip carrier 300.

Figure 6:
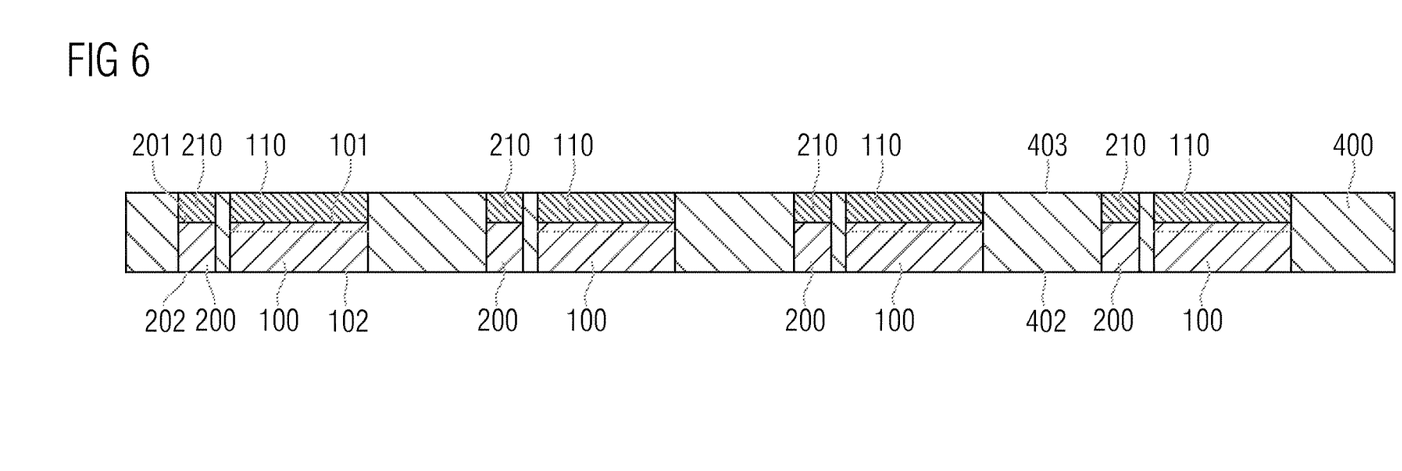
FIG. 6 depicts a cross-section through the mold body after removing a part of the mold body.

In a subsequent method step, a part of the mold body 400 is removed starting from the upper surface 401 of the mold body 400 in order to render the sacrificial layer 110 of each optoelectronic semiconductor chip 100 and the contact-pin-sacrificial layer 210 of each contact pin 200 accessible. The partial removal of the mold body 400 may optionally be carried out even prior to removing the mold body 400 from the chip carrier 300. FIG. 6 shows a schematic sectional view of the mold body 400 after a part of the mold body 400 has been removed.

Starting from the upper surface 401, the mold body 400 has partially been removed so that the mold body 400 now has a recessed upper surface 403. At the recessed upper surface 403 of the mold body 400, the sacrificial layer 110 of each optoelectronic semiconductor chip 100 and the contact-pin-sacrificial layer 210 of each contact pin 200 are accessible.

The partial removal of the mold body 400 starting from the upper surface 401 of the mold body 400 is carried out until the sacrificial layers 110, 210 at the recessed upper surface 403 are accessible. The partial removal of the mold body 400 may optionally be repeated until a part of the sacrificial layers 110 of the optoelectronic semiconductor chips 100 and the contact-pin-sacrificial layers 210 of the contact pins 200 have been removed, as well.

The partial removal of the mold body 400 may, e.g., be carried out by grinding off the mold body 400. Advantageously, the ground-off recessed upper surface 403 of the mold body 400 is then particularly plane and smooth.

Advantageously, grinding or other kinds of partially removing the mold body 400 starting from the upper surface 401 of the mold body 400 is carried out in the direction of the sacrificial layers 110, 210 of the optoelectronic semiconductor chips 100 and of the contact pins 200 and, at most, into the sacrificial layers 110, 210. Thereby, damage of the optoelectronic semiconductor chips 100 and/or the contact pins 200 during partial removal of the mold body 400 is advantageously prevented.

Alternatively, it is also possible to form the mold body 400, e.g., by foil-assisted transfer molding in such a way that the sacrificial layer 110 of each optoelectronic semiconductor chip 100 and the contact-pin-sacrificial layer 210 of each contact pin 200 are not covered by the mold body 400, but accessible at the upper surface 401. In this case, the partial removal of the mold body 400 may be omitted. The recessed upper surface 403 of the mold body 400 then corresponds to its upper surface 401.

Figure 7:
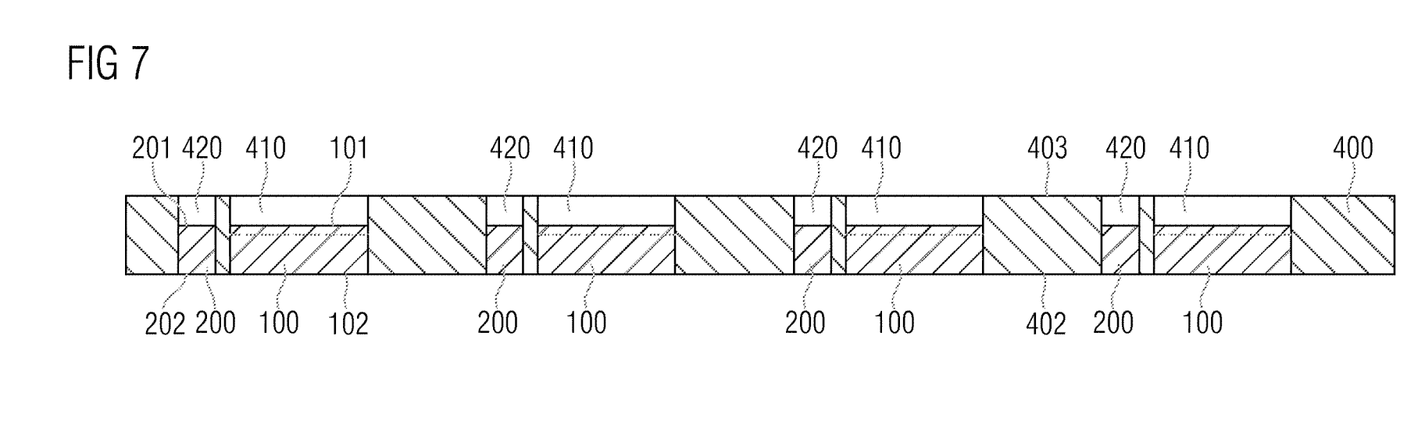
FIG. 7 shows a cross-section through the mold body after removing the sacrificial layers arranged on the semiconductor chips.

The sacrificial layers 110, 210 of the optoelectronic semiconductor chips 100 and contact pins 200 accessible at the recessed upper surface 401 of the mold body 400 may be removed in a following method step. The sacrificial layers 110, 210 may, e.g., be removed by means of a solvent. FIG. 7 shows a schematic sectional view of the mold body 400 after removal of the sacrificial layers 110, 210.

By removing the sacrificial layers 110, 210, recesses have been produced at the recessed upper surface 403 of the mold body 400. Above the first surface 101 of each optoelectronic semiconductor chip 100 embedded in the mold body 400, a first recess 410 has respectively been formed which prior to that was filled by the respective sacrificial layer 110. Above the first side 201 of each contact pin 200 embedded in the mold body 400, a second recess 420 has respectively been formed which prior to that was filled by the respective contact-pin-sacrificial layer 210.

Due to the first recesses 410, the first electrical contacts 103 of the optoelectronic semiconductor chips 100 arranged at the first surfaces 101 of the optoelectronic semiconductor chips 100 are accessible. The first sides 201 of the contact pins 200 are accessible via the second recesses 420.

The depth of the first recesses 410 and second recesses 420 in a direction perpendicular to the recessed upper surface 403 of the mold body 400 corresponds to the thickness of the sacrificial layers 110, 210 remaining in the mold body 400 after partial removal of the mold body 400 in the status of the mold body 400 depicted in FIG. 6.

The lateral dimensions of the first recesses 410 very precisely correspond to the lateral dimensions of the first surfaces 101 of the optoelectronic semiconductor chips 100. In the same way, the lateral dimensions of the second recesses 420 very precisely correspond to the lateral dimensions of the first sides 201 of the contact pins 200. The first recesses 410 are very precisely arranged above the first surfaces 101 of the respective optoelectronic semiconductor chips. Correspondingly, the second recesses 420 are arranged very precisely above the first sides 201 of the respective contact pins 200. Advantageously, the preciseness of the sizes and positions of the recesses 410, 410 is achieved without requiring a correspondingly precise placing and structuring step.

In a subsequent method step, the mold body 400 may be divided in order to separate the optoelectronic semiconductor chips 100 embedded in the mold body 400 from each other. The mold body 400 is divided up into a plurality of smaller mold-body parts 430. In each of the mold-body parts 430, e.g., an optoelectronic semiconductor chip 100 and one or several contact pins 200 associated with the optoelectronic semiconductor chip 100 may be embedded. Subsequently, further processing of the mold-body parts 430 separated from each other is carried out.

Figure 8:
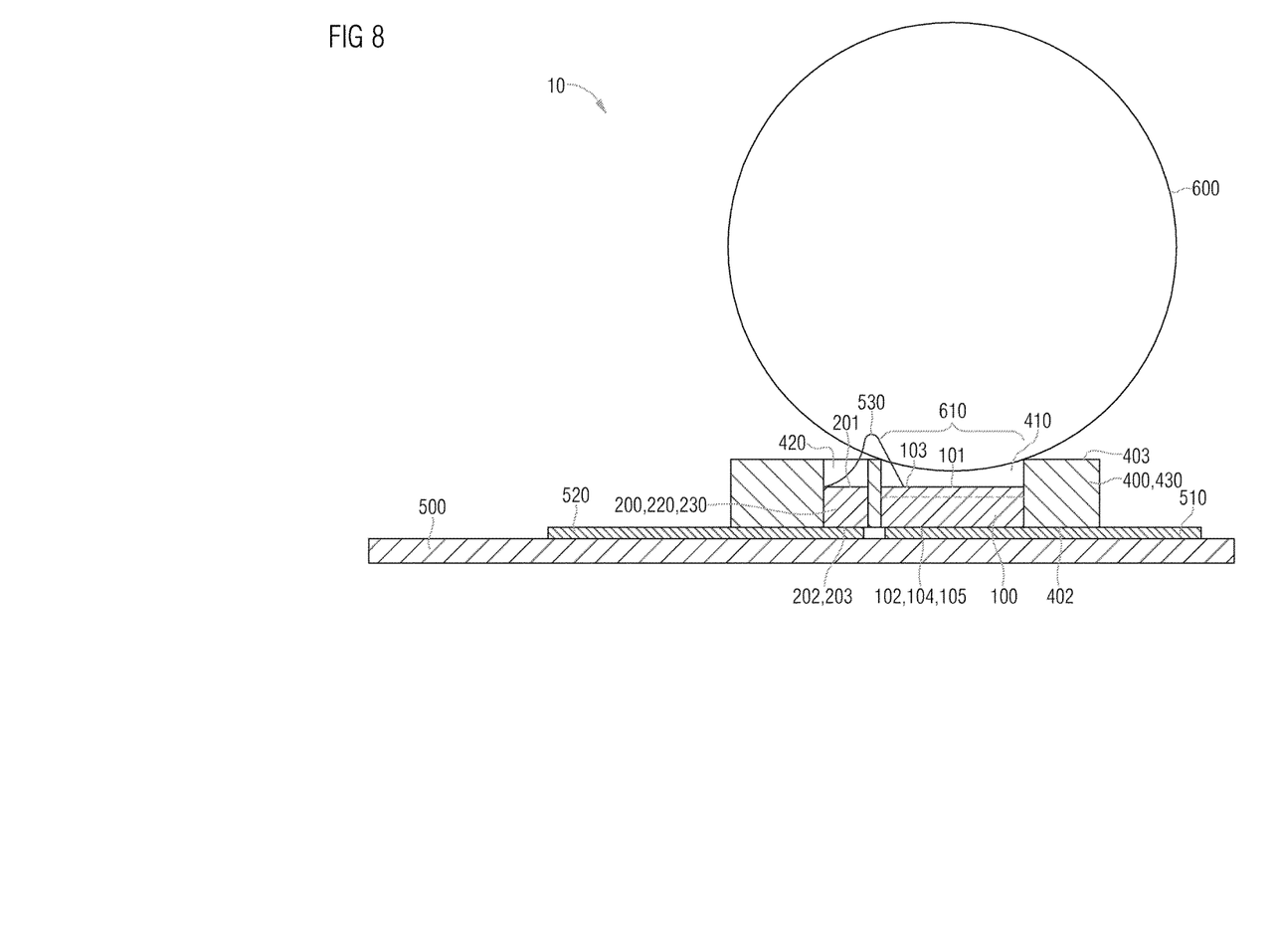
FIG. 8 depicts a sectional view of an optoelectronic component.
Figure 9:
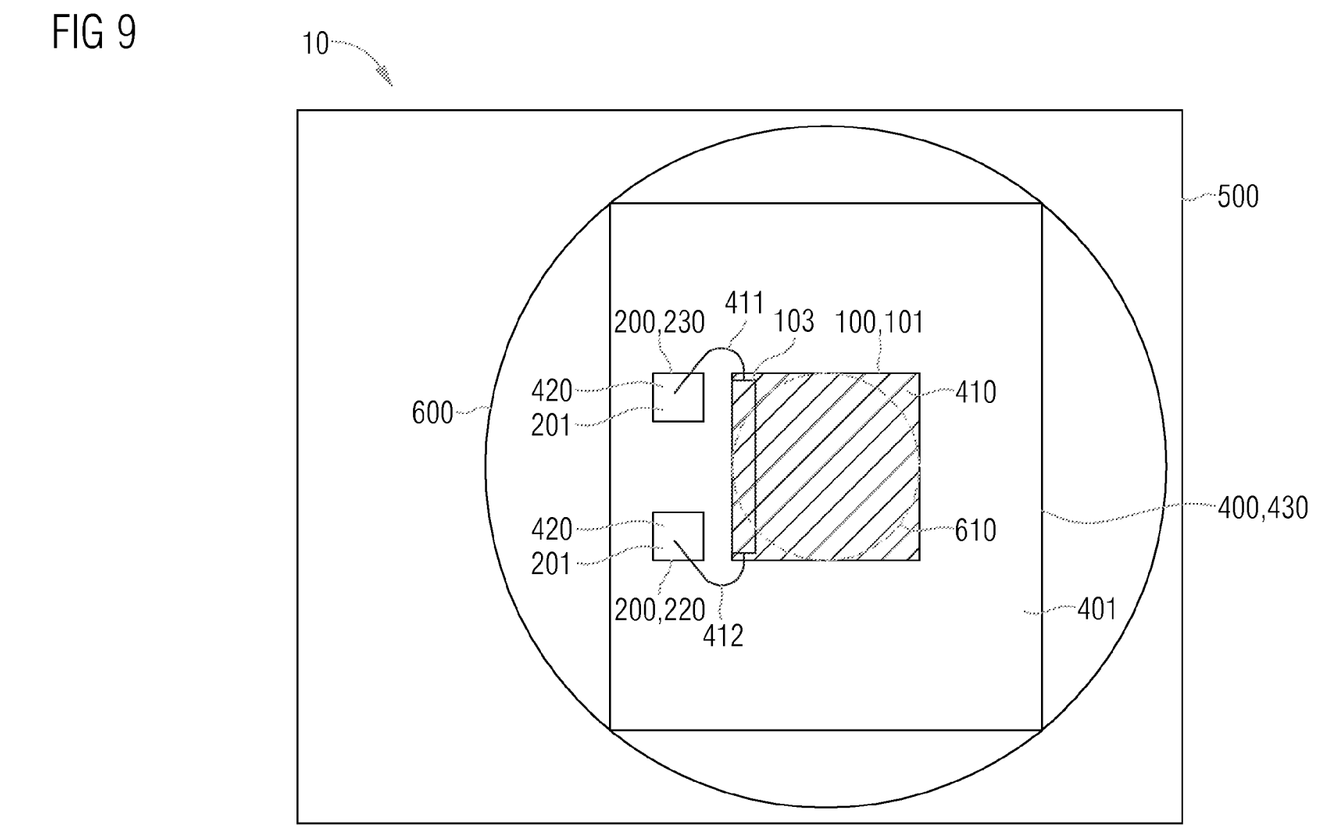
FIG. 9 shows a top view onto the optoelectronic component.

FIG. 8 depicts a schematic sectional view of an optoelectronic component 10 comprising one of the mold-body parts 430. FIG. 9 shows a top view onto the optoelectronic component 10. The optoelectronic component 10 may, e.g., be a light-emitting diode or a photovoltaic element.

It is obvious from FIG. 9 that two contact pins 200, a first contact pin 220 and a second contact pin 230, are embedded in the mold-body part 430 of the optoelectronic component 10 next to an optoelectronic semiconductor chip 100. However, it is also conceivable to only provide one contact pin 200 or more than two contact pins 200.

The mold-body part 430 is arranged on a circuit carrier 500. The circuit carrier 500 is in the form of a flat board and comprises a first carrier metallization 510 and a second carrier metallization 520 on one of its surfaces. The first carrier metallization 510 and the second carrier metallization 520 are electrically isolated from each other. The mold-body part 430 is arranged on the circuit carrier 500 in such a way that the bottom surface 402 of the mold-body part 430 faces the carrier metallizations 510, 520.

The second electrical contact 104 at the second surface 102 of the optoelectronic semiconductor chip 100 embedded into the mold-body part 430 and, as the case may be, the first contact pad 105 formed at the second electrical contact 104 are in contact with the first carrier metallization 510 of the circuit carrier 500, so that an electrically conductive connection exists between the second electrical contact 104 and the first carrier metallization 510.

The second side 202 of both the contact pins 200, 220, 230 embedded in the mold-body part 430 and, as the case may be, the second contact pads 203 formed at the second sides 202 of the contact pins 200 are in contact with the second carrier metallization 520 of the circuit carrier 500, so that an electrically conductive connection exists between the second carrier metallization and the second sides 202 of the contact pins 200, 220, 230.

Preferably, the mold-body part 430 has been arranged on the circuit carrier 500 by means of reflow soldering or by means of a different surface-mounting technique (SMT). For this purpose, the second surface 102 of the optoelectronic semiconductor chip 100 should comprise the first contact pad 105 formed as a metallization and the second sides 202 of the contact pins 200, 220, 230 should comprise the second contact pads 203 formed as a metallization. An advantage of the described method of producing the optoelectronic component 10 is that the contact pads 105, 203 may be formed at the optoelectronic semiconductor chips 100 and the contact pins 200 even prior to embedding the optoelectronic semiconductor chips 100 and the contact pins 200 in the mold body 400.

An electrically conductive connection 530 exists between the first electrical contact 103 at the first surface 101 of the optoelectronic semiconductor chip 100 and the first side 201 of each contact pin 200, 220, 230. The electrically conductive connections 530 are preferably produced by means of a thin wire (bond wire) which extends from the first electrical contact 103 at the first surface 101 of the optoelectronic semiconductor chip 100 via the recessed upper surface 403 of the part of the mold body 400 arranged between the optoelectronic semiconductor chip 100 and the respective contact pin 200, 220, 230 to the first side 201 of the respective contact pin 200, 220, 230. The electrically conductive connection 530 between the optoelectronic semiconductor chip 100 and the first contact pin 220 thereby runs along a first corner region 411 of the first recess 410 of the mold body 430. The electrically conductive connection 530 between the optoelectronic semiconductor chip 100 and the second contact pin 200, 230 runs along a second corner region 412 of the first recess 410 of the mold-body part 430.

An optical lens 600 is arranged above the recessed upper surface 403 of the mold-body part 430 of the optoelectronic component 10. In the shown example, the optical lens 600 is a spherical lens. However, the optical lens 600 may have a different shape. The optical lens 600 is precisely oriented above the first surface 101 of the optoelectronic semiconductor chip 100 forming a radiation-passage area. This is achieved by the abutment of the optical lens 600 to the border of the first recess 410 of the mold-body part 430. The border of the first recess 410 thus forms an adjustment area 610. The adjustment area 610 is integrally formed with the mold-body part 430 of the optoelectronic component 10. The abutment of the optical lens 600 at the adjustment area 610 formed by the first recess 410 allows for a self-aligning arrangement and alignment of the optical lens without requiring complex placement of the optical lens 600 for this purpose. The electrically conductive connections 530 running along the corner regions 411, 412 of the first recess 410 are not affected by the optical lens 600.

The first recess 410 and/or the second recess 420 may optionally be completely or partially filled with a silicone material or with a different material prior to arranging the optical lens 600 above the recessed upper surface 403 of the mold-body part 430. The filler material may optionally contain particles for wavelength conversion.

The present invention has been depicted and described in detail in conjunction with the preferred embodiments. However, the present invention is not limited to the disclosed examples. Rather, other variants may be devised by the person skilled in the art without exceeding the scope of protection.

The invention claimed is:

1. An optoelectronic component comprising:
an optoelectronic semiconductor chip obtained by cleaving an optoelectronic semiconductor wafer, the optoelectronic semiconductor chip having a first surface formed of a first surface of the optoelectronic semiconductor wafer and a second surface formed of a second surface of the optoelectronic semiconductor wafer; and
a mold body having a bottom surface and an upper surface, wherein the optoelectronic semiconductor chip is embedded in the mold body,
wherein the first surface of the optoelectronic semiconductor chip is accessible at the upper surface of the mold body,
wherein the upper surface of the mold body is elevated with regard to the first surface of the optoelectronic semiconductor chip, and
wherein the second surface is accessible at the bottom surface of the mold body and is flush with the bottom surface of the mold body.

2. The optoelectronic component of claim 1, wherein the first surface of the optoelectronic semiconductor chip is configured for a passage of electromagnetic radiation.

3. The optoelectronic component of claim 1, further comprising an optical lens arranged at the upper surface of the mold body.

4. The optoelectronic component of claim 3, wherein the optical lens abuts an adjustment structure that is formed integrally with the mold body.

5. The optoelectronic component of claim 1, further comprising:
an electrically conductive contact pin embedded in the mold body, the contact pin being accessible at the upper surface of the mold body; and
an electrical contact arranged at the first surface of the optoelectronic semiconductor chip and in an electrically conductive connection with the contact pin.

6. The optoelectronic component of claim 1, further comprising a metallization arranged at the second surface of the optoelectronic semiconductor chip.

7. The optoelectronic component of claim 6, further comprising a carrier electrically connected to the optoelectronic semiconductor chip by the metallization.

* * * * *